(12) United States Patent
Real et al.

(10) Patent No.: US 8,866,660 B2
(45) Date of Patent: Oct. 21, 2014

(54) DATA ADAPTIVE ANALOG TO DIGITAL CONVERTER

(71) Applicant: BAE Systems Information and Electronic Systems Integration Inc., Nashua, NH (US)

(72) Inventors: Edward C. Real, Nashua, NH (US); Joanne K. Como, Chichester, NH (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 0 days.

(21) Appl. No.: 13/868,181

(22) Filed: Apr. 23, 2013

(65) Prior Publication Data

US 2013/0285845 A1 Oct. 31, 2013

Related U.S. Application Data

(60) Provisional application No. 61/638,205, filed on Apr. 25, 2012.

(51) Int. Cl.
*H03M 1/12* (2006.01)
*H03M 1/18* (2006.01)

(52) U.S. Cl.
CPC ............... *H03M 1/12* (2013.01); *H03M 1/186* (2013.01)
USPC ........... 341/155; 348/488; 348/500; 348/578; 348/593; 348/594; 375/350; 375/295; 375/260; 375/259; 375/261; 455/136; 455/138; 455/232.1; 370/252; 370/254; 370/338; 370/473

(58) Field of Classification Search
CPC ......... H03M 1/12; H03M 1/14; H03M 1/181; H03M 1/186; H03M 1/0614; G10L 21/02166; G10L 21/0208; G10L 21/0272; H04N 5/262; H04N 5/272; H04L 27/2624; H04L 61/10; H04L 61/2046; H04L 61/2092; H04L 29/12018; H04L 29/12264; H04L 29/1232; H04S 3/008; H03G 3/30; H03G 3/3052; H03G 3/3089
USPC .......... 341/125–155; 348/488, 500, 578, 593, 348/594; 375/350, 295, 260, 259, 261, 298, 375/316, 345; 704/226, 227, 200, 231, 270; 381/302; 455/136, 138, 232.1, 234.1, 455/234.2; 370/252, 254, 338, 473
See application file for complete search history.

(56) References Cited

U.S. PATENT DOCUMENTS

| | | | | |
|---|---|---|---|---|
| 6,038,434 | A * | 3/2000 | Miyake | 455/186.1 |
| 6,038,435 | A * | 3/2000 | Zhang | 455/234.1 |
| 6,097,324 | A * | 8/2000 | Myer et al. | 341/118 |
| 7,202,804 | B2 * | 4/2007 | Nakagaki et al. | 341/118 |

* cited by examiner

*Primary Examiner* — Lam T Mai
(74) *Attorney, Agent, or Firm* — Daniel J. Long

(57) ABSTRACT

A system and method for mitigating Analog to Digital (A/D) clipping is disclosed. The mean and variance of analog input data are tracked and the bits of A/D are dynamically reassigned to keep the input signal within their range. The quantization levels of A/D are dynamically re-mapped to avoid changes in sensitivity of sensor system. The method is based on random walk statistic and keeps the sensitivity of the sensor system constant. Also the system and method provides a way to mitigate A/D clipping that avoids changing the sensitivity by dynamically re-mapping the quantization levels of the A/D, keeping the sensitivity of the system constant.

16 Claims, 13 Drawing Sheets

DATA ADAPTIVE ANALOG TO DIGITAL CONVERTER

CROSS-REFERENCE TO RELATED APPLICATIONS

This Application claims rights under 35 USC §119(e) from U.S. Application Ser. No. 61/638,205 filed Apr. 25, 2012 the contents of which are incorporated herein by reference.

TECHNICAL HELD

Embodiments are generally related to sensor systems. Embodiments also relate to methods and apparatus for mitigating analog to digital clipping. Embodiments additionally relate to data adaptive Analog to Digital (A/D) converter that avoids change in sensitivity of sensor system by dynamically re-mapping the quantization levels.

BACKGROUND OF THE INVENTION

Analog to Digital (A/D) clipping is a major factor in limiting the effectiveness of many sensor systems. Most often the cause is the high dynamic range of signals and/or clutter in the uncontrolled environment. The most prevalent strategy for mitigating this problem is automatic gain control (AGC), which essentially adjusts the sensitivity of the sensor-A/D system. The problem with changing the sensitivity is that it can inadvertently cause other problems. For example, if the sensitivity is decreased, a weak signal can be missed if it occurs during the time of low sensitivity.

A need, therefore, exists for a way to mitigate A/D clipping that avoids changing the sensitivity by dynamically re-mapping the quantization levels of the A/D, keeping the sensitivity of the system constant

BRIEF SUMMARY

The following summary is provided to facilitate an understanding of some of the innovative features unique to the disclosed embodiment and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for sensor systems.

It is another aspect of the disclosed embodiments to provide for methods and apparatus for mitigating analog to digital clipping.

It is a further aspect of the disclosed embodiments to provide for data adaptive Analog to Digital (A/D) converter that avoids change in sensitivity of sensor system by dynamically re-mapping the quantization levels.

The aforementioned aspects and other objectives and advantages can now be achieved as described herein. According to the present invention, statistics of the signal data are tracked, in particular the mean and the variance of the analog input data, and, using this information, the system dynamically reassigns the bits of the A/D to keep the input signal within their range. This method is based on the random walk statistic. A generalized random walk approach takes into account the statistics of the input data step sizes where the basic approach assumes a constant step size. The more generalized approach worked very well to resolve copping on both simulated and one real world imagery example.

BRIEF DESCRIPTION OF THE DRAWINGS

The accompanying figures, in which like reference numerals refer to identical or functionally-similar elements throughout the separate views and which are incorporated in and form a part of the specification, further illustrate the disclosed embodiments and together with the detailed description of the invention, serve to explain the principles of the disclosed embodiments.

DETAILED DESCRIPTION

The particular values and configurations discussed in these non-limiting examples can be varied and are cited merely to illustrate at least one embodiment and are not intended to limit the scope thereof.

Figure 1:
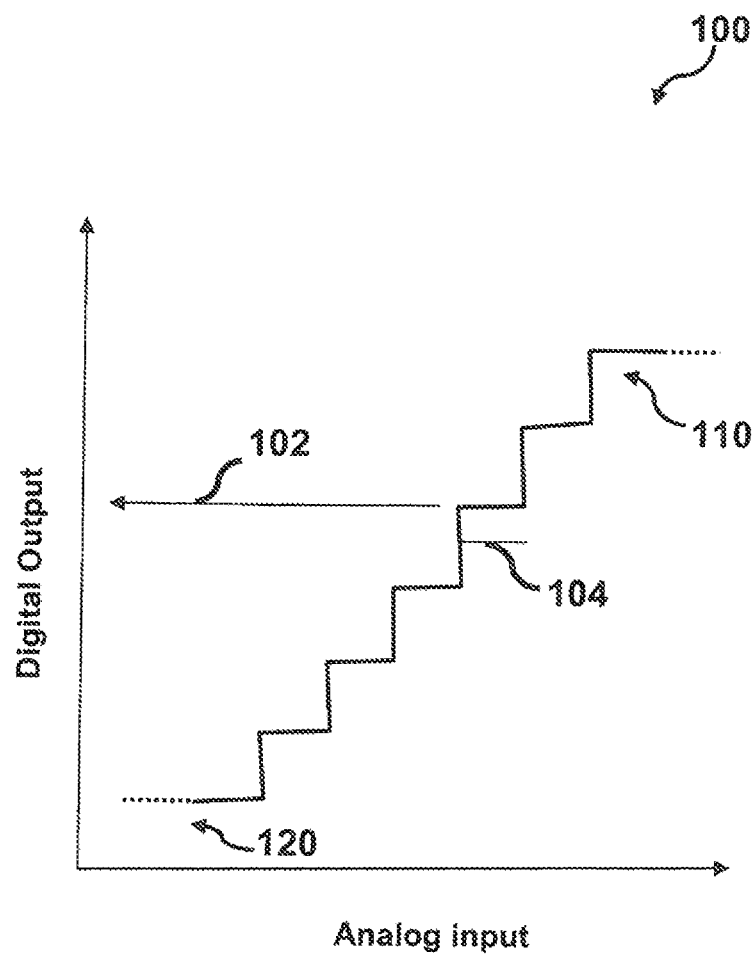
FIG. 1 illustrates a schematic diagram showing the functioning of Analog to Digital (A/D) converter, in accordance with the disclosed embodiments.

Typical A/D converters have a fixed number of bits that are allocated across a fixed range. FIG. 1 illustrates a schematic diagram 100 showing the functioning of Analog to Digital (A/D) converter. Analog inputs above value as referred by numeral 110 will result in clipping due to overflow condition. Similarly inputs below value as referred by numeral 120 will be clipped due to an underflow condition. For analog input range as mentioned in numeral 104, output produced is mentioned in numeral 102.

Figure 2:
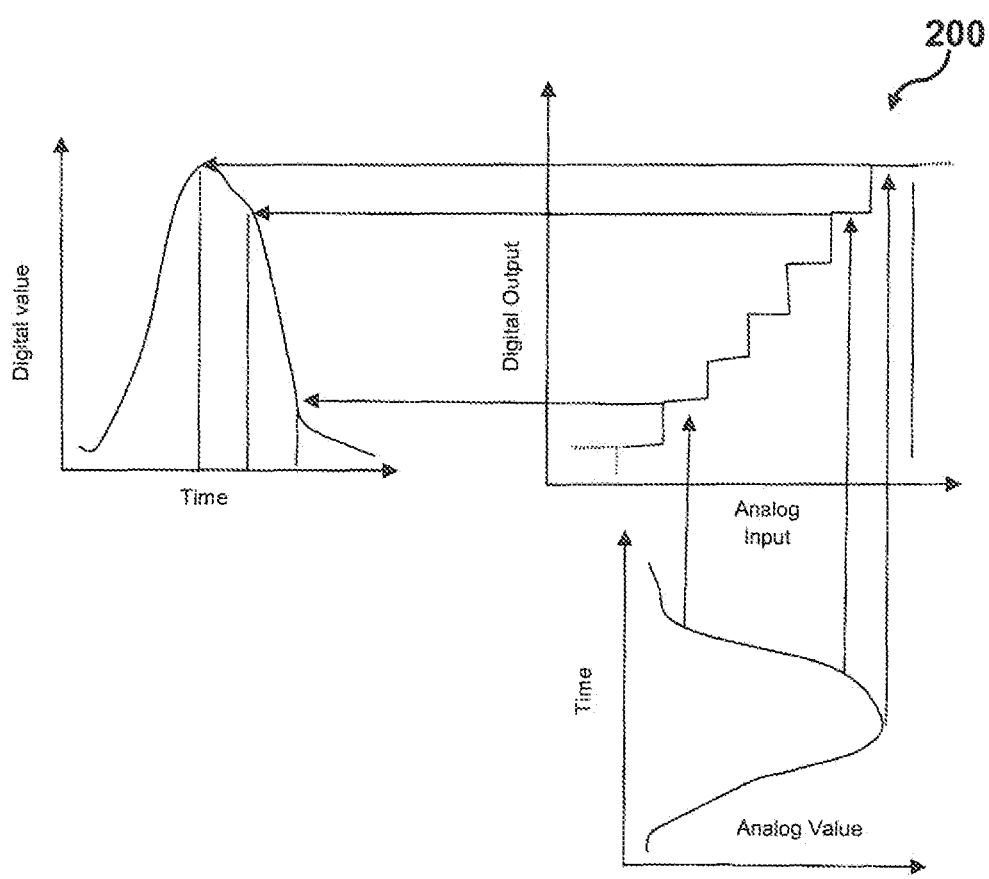
FIG. 2 illustrates a normal operation of A/D, in accordance with the disclosed embodiments.

As long as the distribution of analog input data remains within the design range of the A/D, clipping and underflow will not result. The swing of analog input data and corresponding digital output under normal operation flow 200 of an A/D is illustrated in FIG. 2.

Figure 3:
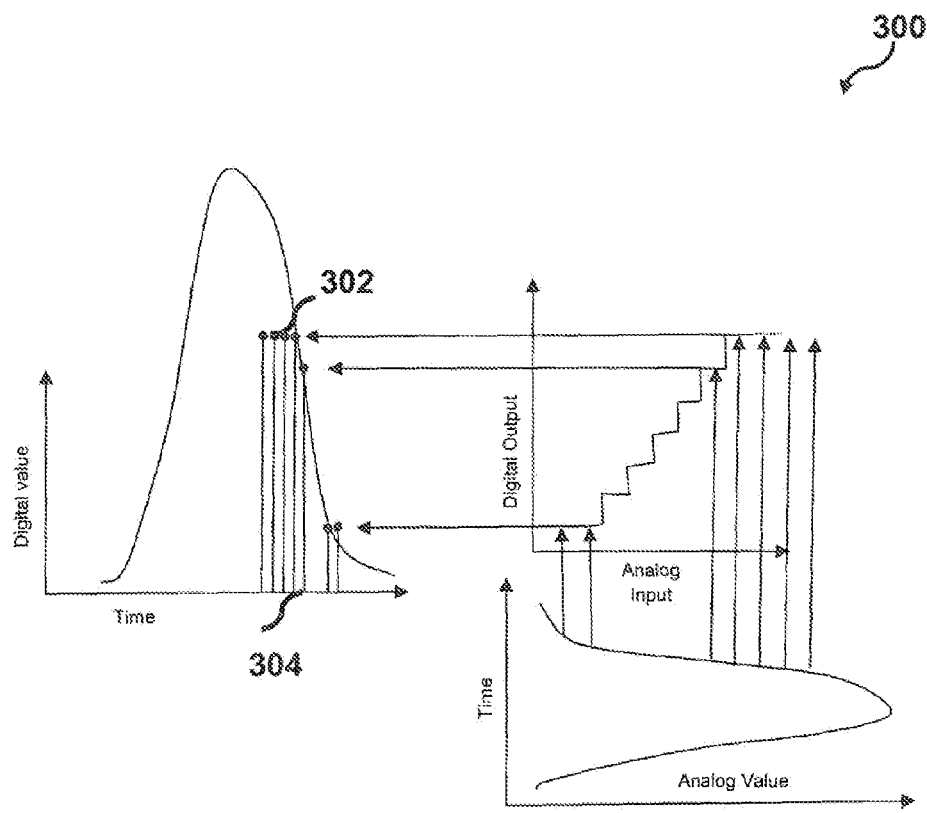
FIG. 3 illustrates a A/D with clipping and underflow, in accordance with the disclosed embodiments.

However, if the swing of analog input data is in the outside of design range of A/D, clipping 302 or underflow 304 will result as shown in FIG. 3 with the overall flow referred by numeral 300.

One solution to this problem is to just have lots of bits to cover all expected variations of the data (shifts in mean and variance, possibly skewness), but extra A/D bits are expensive. The "Moore's Law" time constant for another A/D bit is about 7 years. Another solution is to track the statistics of the data so that the bits of the A/D can be used most effectively. In particular, if the mean and variance (standard deviation) of the analog input could be tracked, then the allocation of bits could be dynamically re-assigned to keep the input analog signal within their range. A method to do dynamic re-assigning of bits is based on random walk statistics which is explained as follows Suppose a signal is watched in time, the signal's up and down movements can be modeled as a random walk. As an initial approach, suppose the signal moved up with probability 'p' during a predetermined interval of time. After N such intervals of time the expected number of times a signal would have moved up would be Np. It can be shown that the variance in this up and down movement would be Np(1-p). Let $n_1$ be the number of times the signal moves up in N time intervals. Let $n_2$ be the number of times the signal moves down in N time intervals. Let $m=n_1-n_2$.

Figure 4:
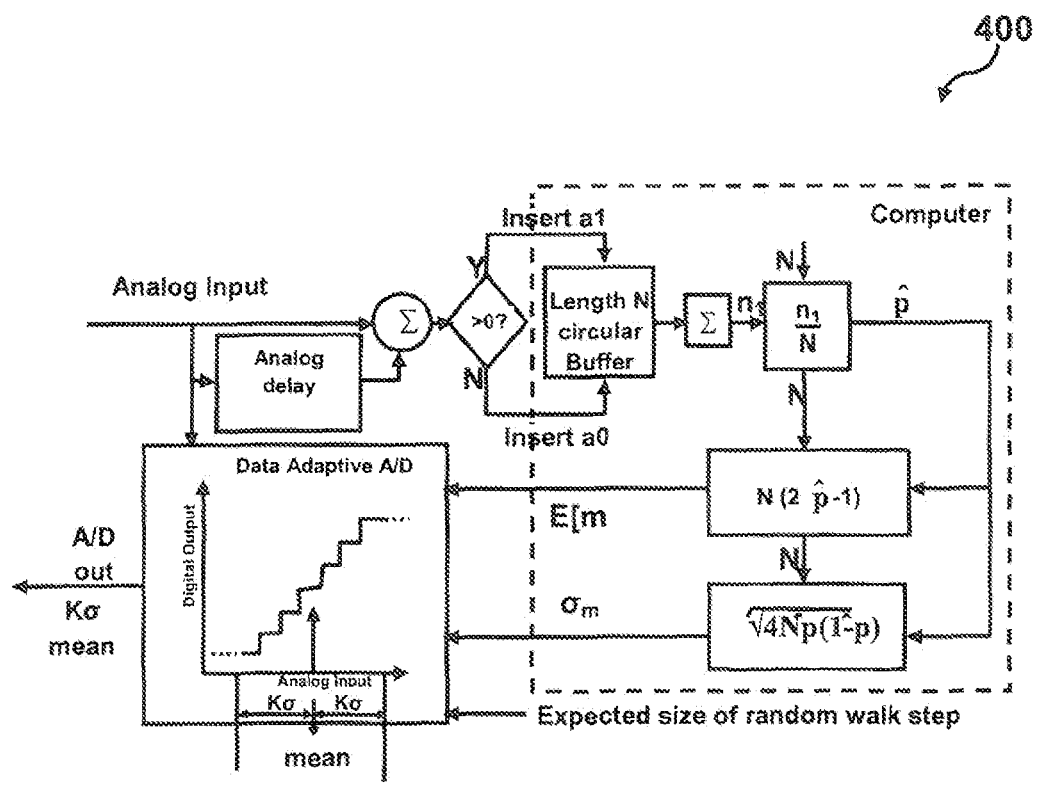
FIG. 4 illustrates a block diagram of data adaptive A/D using Basic Random Walk process, in accordance with the disclosed embodiments.

It can be shown that the mean value for m is N(2p-1), and the variance for m is 4Np(1-p). If the mean value for m, and its variance are tracked, they can be tracked where the bits in the A/D should be centered, and those bits can be adjusted as the analog signal mean and variance shifts over time. The skewness can also tracked for even more bit placement effectiveness, but we will here deal with mean and variance to keep it simple. FIG. 4 illustrates a block diagram 400 of data adaptive A/D using Basic Random Walk process. Note that the mean and standard deviation estimates fed to the smart A/D would also have to be sent to the application so that it could know the meaning of the A/D outputs. Note also that, for a fixed number of bits, the size of the A/D "steps" would change over time and would have to be accounted for in subsequent processing. With this as initial approach, it is attempted to mitigate clipping and underflow issues, Design goal was to allow an application to use a limited number of available bits to maximum advantage, with the operations simple and straightforward. This approach has only a single divide and a single square root.

Figure 5:
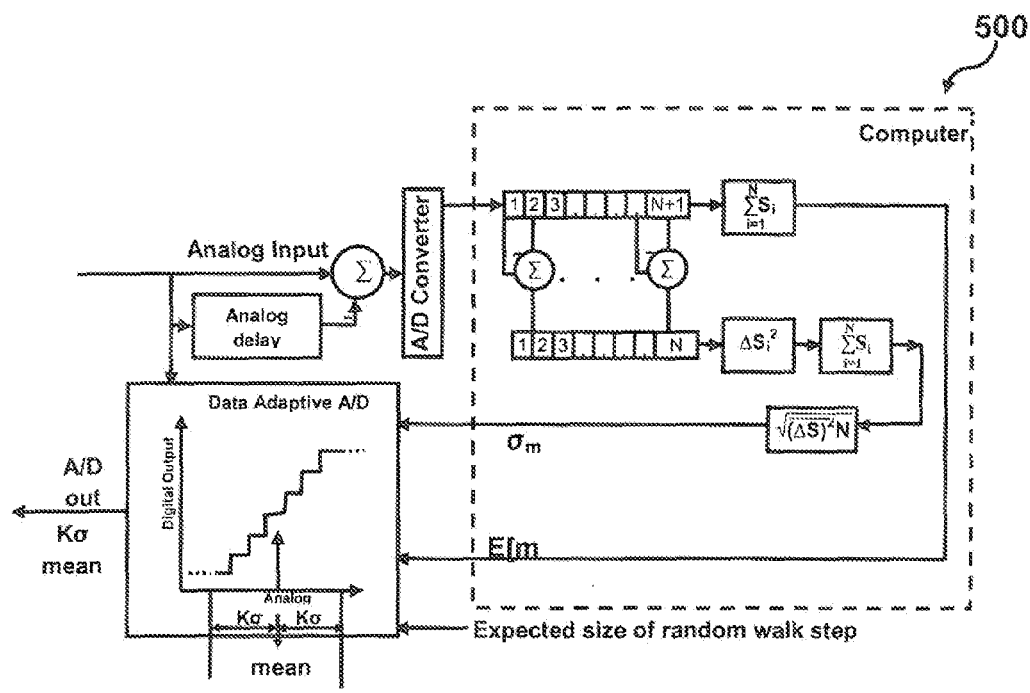
FIG. 5 illustrates a block diagram of data adaptive A/D using Generalized Random Walk process, in accordance with the disclosed embodiments.

However, real world signals do not always change by a constant amount from one time interval to the next as is assumed when using the basic random walk as described in FIG. 4 This can be due to random noise and/or nonlinearities in the input signal. The statistics of the actual step sizes must be taken into account to obtain the desired results. To account, for the variable step sizes, a more general application of the random walk was used. FIG. 5 illustrates a block diagram 500 of data adaptive A/D using Generalized Random Walk process.

In this approach the step size is determined by subtracting the analog input by a delayed version of this input. This difference would be converted to a digital value by a traditional, but smaller bit size, A/D converter. This A/D converter will not have the same clipping issue as previously discussed since the input values would be differences from one time interval to the next as opposed to the true signal values. The size of these differences can be controlled by the selection of the analog delay, where a decrease in this delay results in smaller differences. The smaller these differences are, the fewer bits are required by this front end A/D. For example, for the application of detecting a flash (e.g. sun glint or a camera flash) using imagery data, the rise time of the events of interest can be on the order of 1 ms. Assuming the rise is linear over this period, the analog delay could be selected to be 10 μs, allowing for the selection of an inexpensive 100 kHz 8 bit A/D as the front end where the actual data would possibly require a high speed 14 bit A/D if the adaptive technique was not employed. These step size values are saved into a buffer of length N+1. The differences between these step values from one sample to the next (the delta s values) are saved into a second buffer of length N. To obtain the expected value at sample N, a summation of the step values over N would be equal to N times the mean of the step sizes. This value is used to determine where the center voltage of the A/D should be located relative to the last adjustment. Squaring and summing the delta step values will yield the standard deviation of the input voltages, which is used to determine the range over which to spread the bits of the A/D converter. There are more operations involved in this approach but these are mainly additions and subtractions with just ingle square root.

One problem that either of these approaches pose is that the applications that either A/D serves would get more complicated. Specifically, constant mean and variance changes would have to be taken into the account. Also, the A/D is more complicated, since bit placement is variable.

Results

Figure 6:
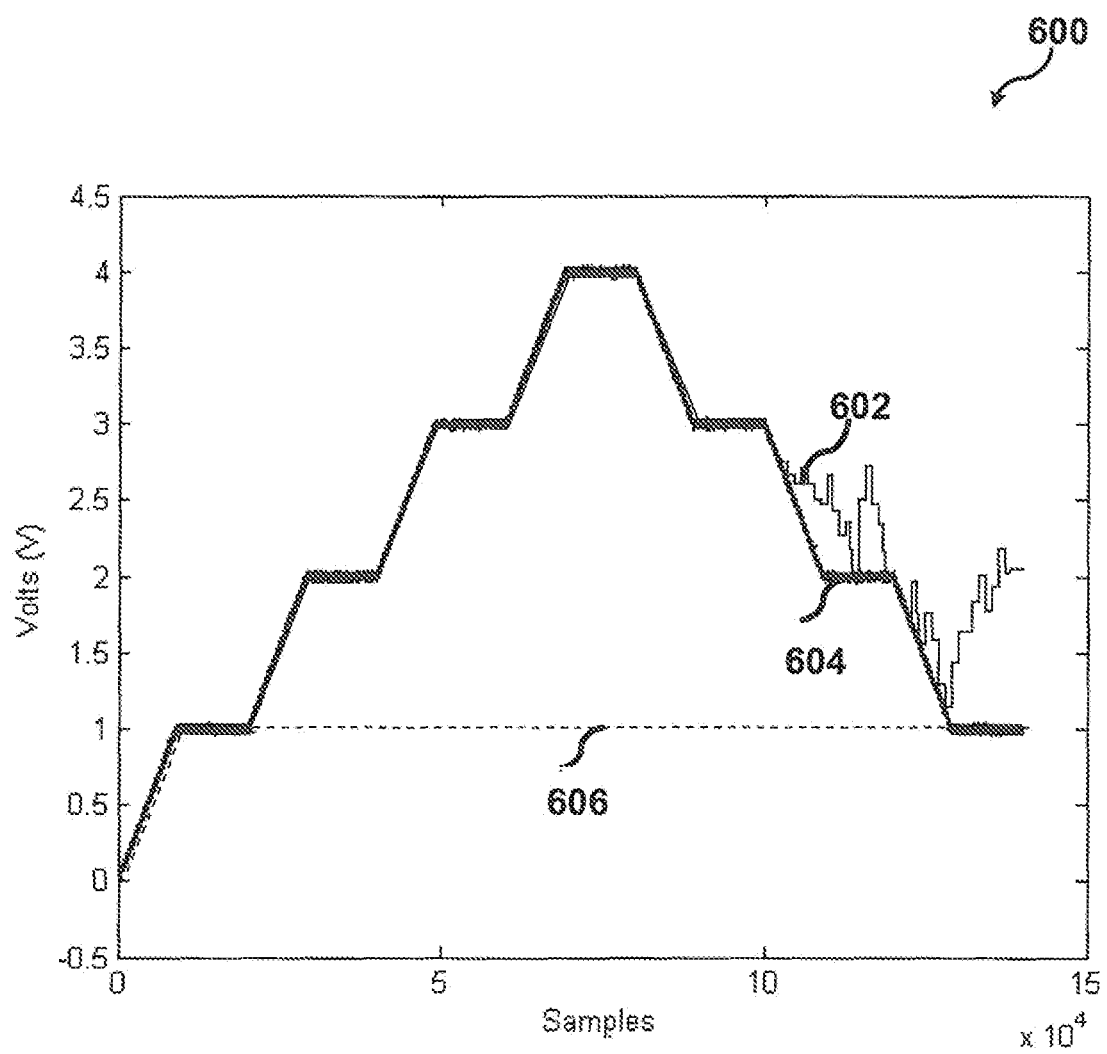
FIG. 6 illustrates a graph showing comparison of output by data adaptive A/D using Basic Random Walk process with fixed voltage step size and output by traditional A/D, in accordance with the disclosed embodiments.

The original approach using the basic random walk (without accounting for variable step size) was tried on a test signal. FIG. 6 illustrates a graph 600 showing comparison of output by data adaptive A/D using Basic Random Walk process with fixed voltage step size and output by traditional A/D. The original signal 604 is a step signal generated to periodically change voltage level with random noise added. As an example, a theoretical 8 bit A/D was simulated where the voltage range of this theoretical A/D was between 0 and 1V. This range was only selected for illustrative purposes and could have been any range. This theoretical output of the traditional A/D is shown in dotted lines 606. It can be seen that for all values above 1V, the traditional A/D clips. The adaptive A/D also contained 8 bits; however the voltage range will vary depending on the statistics calculated from the data. The output of the adaptive A/D with a fixed step size follows the input signal and tracks during noisy region also as depicted by numeral 602. It can be seen that sometimes this approach works very well at tracking the input signal. However, due to the inherent randomness of the actual step size, this device can get off track, as is seen on the right side of the figure. The results of this test led us to pursue the more generalized random walk approach where the statistics on the actual (environmental) step sizes are taken into account.

Figure 7:
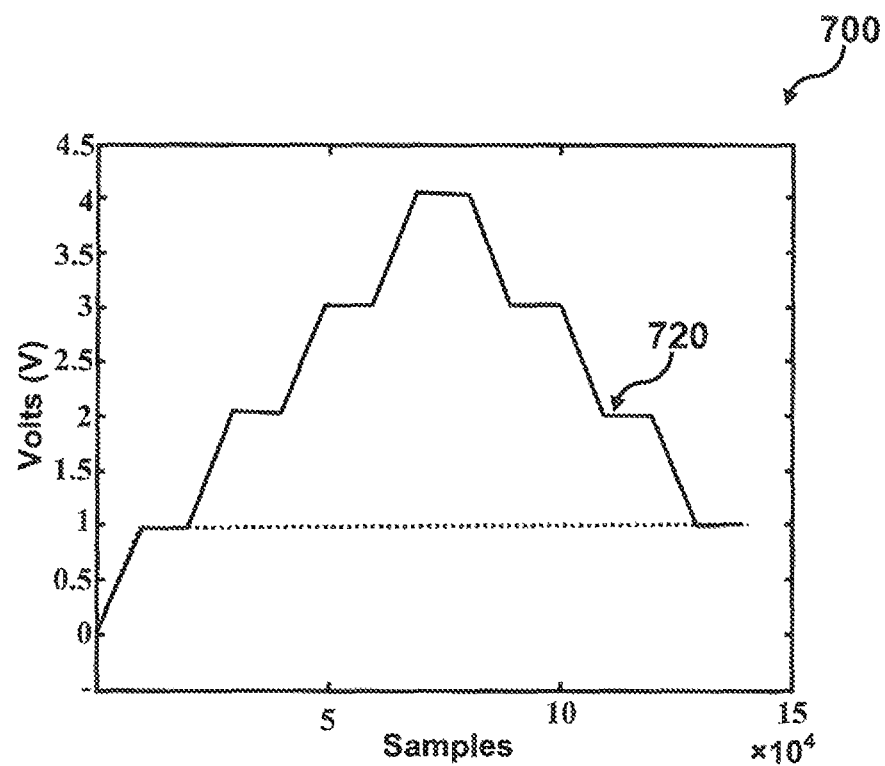
FIG. 7 illustrates a graph showing comparison of output by data adaptive A/D using Basic Random Walk process with variable voltage step size and output by traditional A/D, in accordance with the disclosed embodiments.

FIG. 7 illustrates a graph 700 showing comparison of output by data adaptive A/D using Basic Random Walk process with variable voltage step size and output by traditional A/D. Here the adaptive A/D tracks the input signal very well without getting off track as depicted by numeral 720.

Figure 8:
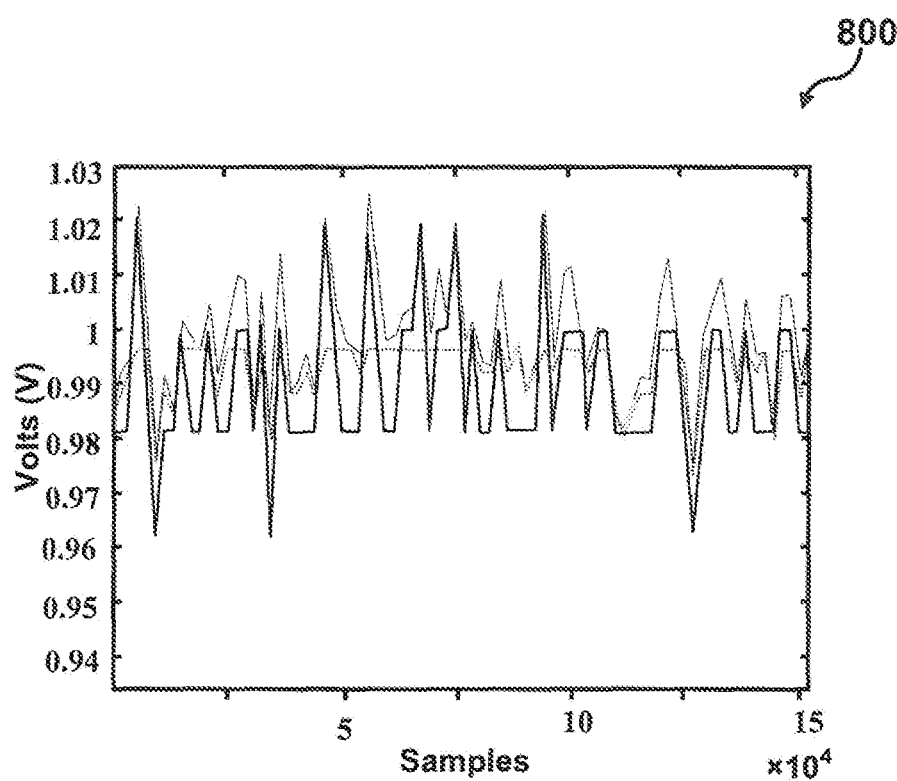
FIG. 8 illustrates a graph showing comparison of output resolution by data adaptive A/D and by traditional A/D in accordance with the disclosed embodiments.

One trade off to using the adaptive approach can be some loss of resolution since the bits can sometimes be spread over a large voltage range. An example of this loss of resolution is shown graph 800 in FIG. 8 which is a zoomed view of FIG. 7. This illustrates a case where the adaptive A/D does not exactly match the input signal since the granularity of the A/D does not allow for an exact match, although it is noted that the spread of the errors in relation to the actual value '1' are limited. Note also that the traditional A/D clips for the majority of the time during this period since most of the values are outside its range, where the adaptive A/D can track multiple voltage levels just at a slightly lower resolution. The voltage range of the adaptive A/D is determined by the standard deviation of the voltage swings seen in the data, so for more constant signals, the resolution should be greater, and for more variable signals the resolution is less. This range is also determined by a scale factor K that is multiplied by the standard deviation. For these examples, K was set to 3, but, this value can be adjusted by the user.

Figure 9:
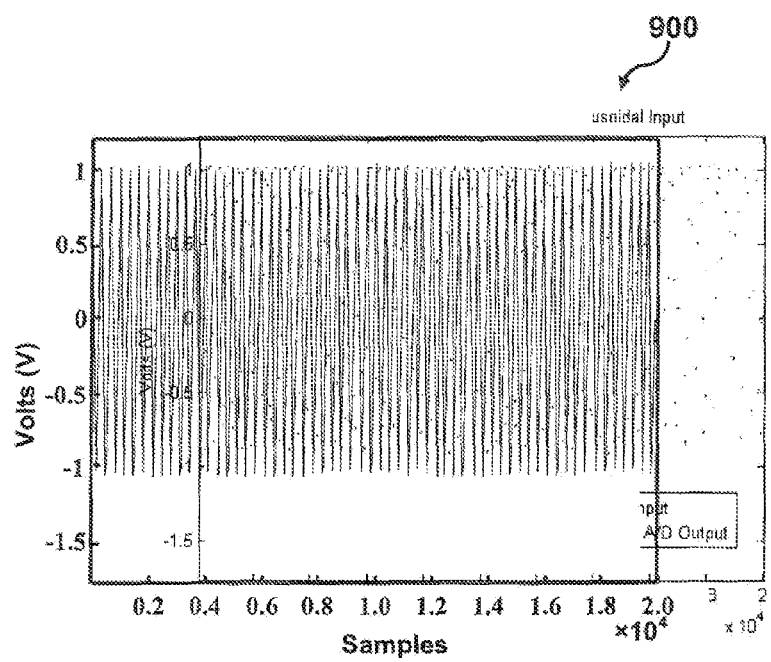
FIG. 9 illustrates a graph showing output by data adaptive A/D with variable voltage step size when a sinusoidal signal is applied at input, in accordance with the disclosed embodiments.

FIG. 9 illustrates a graph 900 showing output by our data adaptive A/D with variable voltage step size when a sinusoidal signal plus random noise is applied at input. This demonstrates that the adaptive A/D works with a signal whose voltage varies through a constant range (constant modulus signals) and does not introduce errors due to its tracking behavior. It also illustrates that the resolution is very good since the bits are not being spread over a large voltage range.

Figure 10:
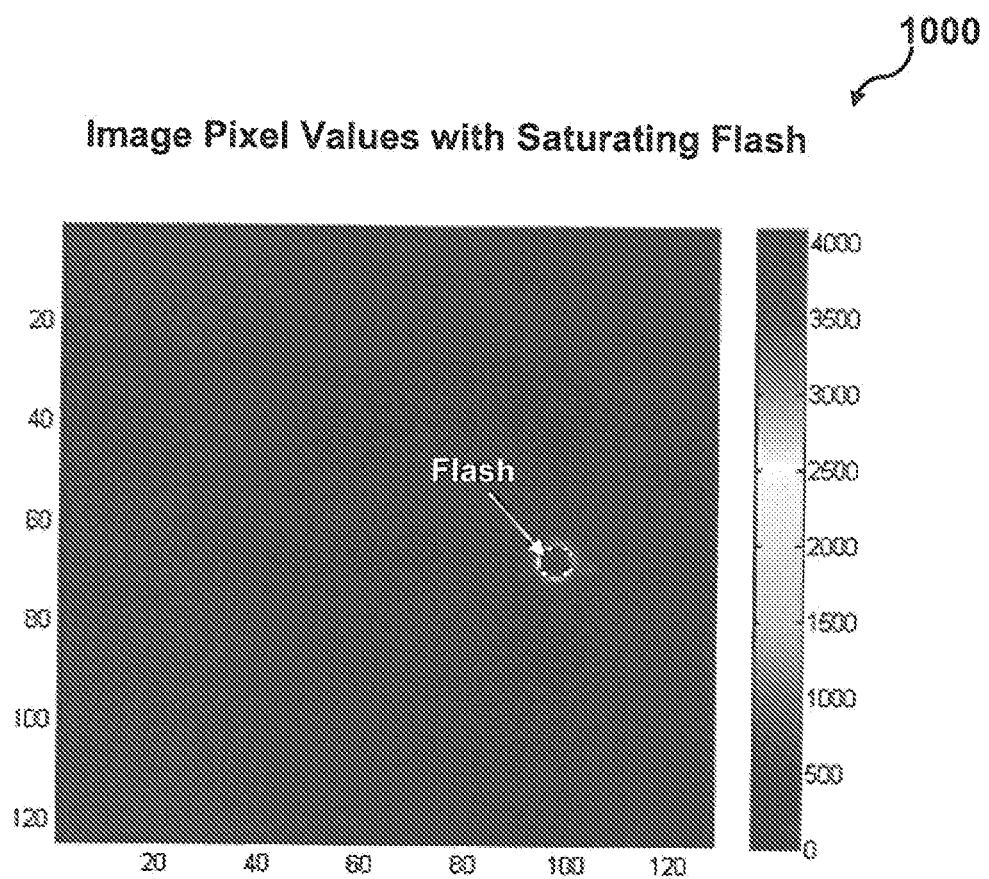
FIG. 10 illustrates a graph showing image pixel values with a flash saturating the image, in accordance with the disclosed embodiments.

A real world situation where A/D clipping frequently occurs is during the collection of imagery data. FIG. 10 illustrate a graph 1000 showing image pixel values with a bright flash saturating the image. The A/D in this system is 12 bits; therefore containing $2^{12}$ or 4096 quantization levels. Therefore the range of levels for this A/D is from 0 to 4095, and any values above 4095 would be clipped. The value of the pixels at the center of the flash shown in FIG. 10 is 4095 and stay at this value for several frames during the flash event, indicating that these pixel values are clipped.

Since the adaptive A/D algorithm assumes access to the original analog data, a pixel that in not clipping was selected to demonstrate the feasibility of the adaptive A/D approach. This pixel was then forced into a clipping situation by reducing the number of bits in the A/D from 12 to 10 bits. The pixel that was selected was just outside the center of the flash. This pixel started out as part of the background prior to the flash event, rose to a high value without clipping during the event, then went back down to a background level as the flash ended. Since the A/D now contains only 10 bits, any values above 1023 should be clipped, and this pixel value well exceeds this value with a max of 3340.

Figure 11:
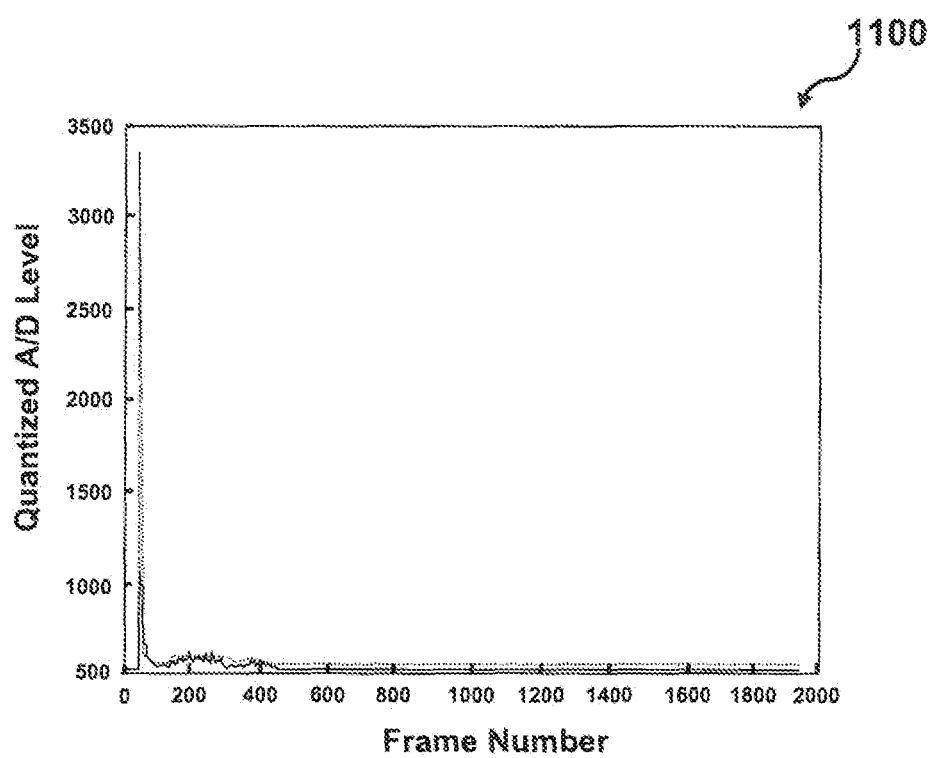
FIG. 11 illustrates a graph showing adaptive A/D output upon tracking actual pixel values and output of traditional A/D, in accordance with the disclosed embodiments.
Figure 12:
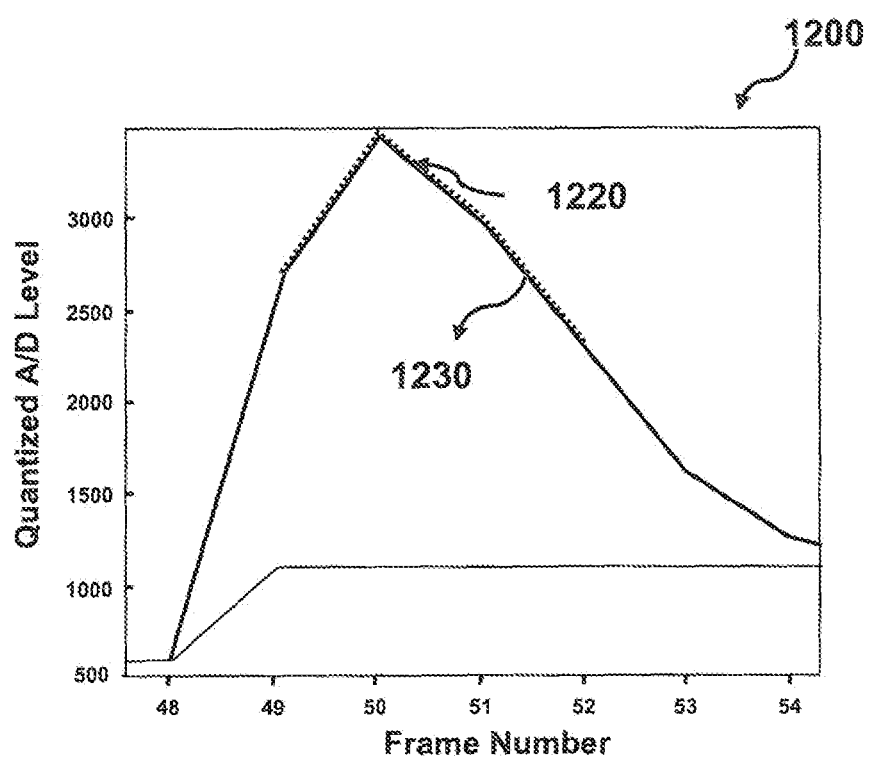
FIG. 12 illustrates a zoomed view of graph depicted in the FIG. 11 in accordance with the disclosed embodiments.

The value of this pixel on a frame by frame basis for the entire series of frames is plotted in FIG. 1 which illustrates a graph 1100 showing adaptive A/D output upon tracking actual pixel values and output of a traditional A/D. It is hard to distinguish between the two (actual vs. adaptive output), since the adaptive A/D converter so closely tracks the actual pixel values. The theoretical output from a traditional 10 bit A/D is shown by the solid line. It can be seen that for values above 1023, the traditional A/D is clipped. FIG. 12 illustrates a zoomed view 1200 of graph depicted in the FIG. 11 here the analog input is referred by numeral 1220 and shown as dotted lines, whereas the output of A/D is referred by numeral 1230 and shown as solid lines. Here the analog delay was limited by the frame rate of the data. In a real system, this delay would be selected to limit the number of bits required in the input A/D.

The adaptive A/D converter using the generalized random walk approach works well in resolving the clipping problem for both test signal as well as a real world imagery example.

The algorithm has parameters that are set by the user, such as the size of the buffer N as well as the scale factor K. The optimal value for these parameters is data dependent. For example, for the simulated signals, N was set to a fairly high value of 1024, since the values varied fairly slowly, but for the imagery example, N was set to 30 since the event was fairly short and the pixel values changed fairly rapidly. The value of K was previously discussed. Recall that this value is a scale factor that is applied to the standard deviation which determines the dynamic range and therefore the resolution of the A/D.

Figure 13:
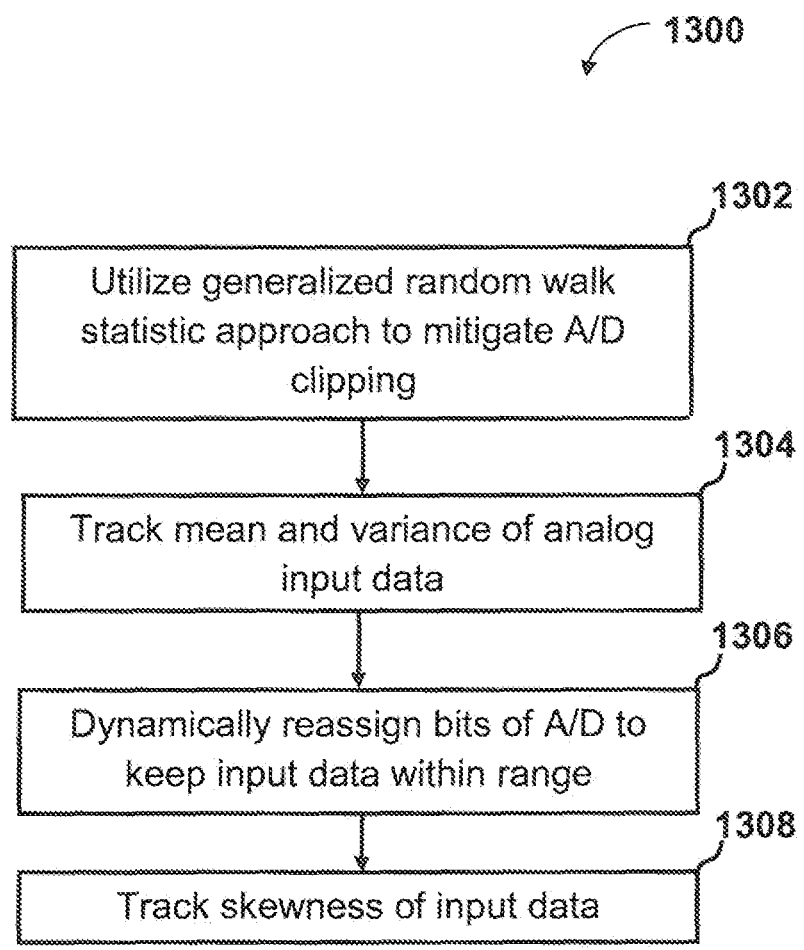
FIG. 13 illustrates a flow chart showing a method for mitigating A/D clipping, in accordance with the disclosed embodiments.

FIG. 13 illustrates a flowchart 1300 showing a method for mitigating A/D clipping. As said at block 1302, to mitigate A/D clipping, a more generalized random walk statistic approach is utilized. The mean and variance of the analog input data are tracked as said as block 1304. Then, the bits of A/D are dynamically reassigned to keep the input data within the range as depicted at block 1306. The quantization levels of A/D are dynamically re-mapped to maintain constant sensitivity of sensor system. The signal's up and down movements as a random walk is modeled in this approach. As depicted at block 1308, the skewness of input data is tracked. Further, bits are adjusted based on shift of mean and variance of an analog signal over time.

Conclusion

A data adaptive A/D algorithm is provided which tracks the statistics of the analog input data. In particular it tracks the mean and the variance of this data and dynamically reassigns the bits of the A/D to keep the input signal within their range. This method is based on the random walk statistic. Initially a basic random walk approach was investigated, but after testing, it was realized that a more generalized random walk approach was needed. The more generalized approach takes into account the statistics of the input data step sizes where the basic approach assumes a constant step size.

The adaptive A/D converter using the generalized random walk approach works well in resolving the clipping problem for both our test signals as well as a real world imagery example. The algorithm has parameters that are set by the user. The optimal settings for these values are data dependent.

While the present invention has been described in connection with the preferred embodiments of the various figures, it is to be understood that other similar embodiments may be used or modifications and additions may be made to the described embodiment for performing the same function of the present invention without deviating there from. Therefore, the present invention should not be limited to any single embodiment, but rather construed in breadth and scope in accordance with the recitation of the appended claims.

It will be appreciated that variations of the above disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A system for mitigating Analog to Digital clipping comprising a sensor system and an Analog to Digital converter coupled with said sensor system, wherein the system is configured for:
    tracking mean and variance of an analog input data provided by the sensor system; and
    dynamically reassigning bits of the Analog to Digital converter to keep said input data within the range of the Analog to Digital converter;
    converting the analog input data into digital data bits by the Analog to Digital converter based on the dynamically reassigned bits.

2. The system of claim 1, wherein the system is configured for tracking skewness of said input data for dynamically reassigning bits.

3. The system of claim 1 wherein the system utilizes a generalized random walk statistic approach for dynamically reassigning bits of the Analog to Digital converter to mitigate Analog to Digital clipping.

4. The system of claim 3 wherein the generalized random walk statistic approach utilizes the input data variable step sizes.

5. The system of claim 1, wherein the Analog to Digital converter is configured for dynamically remapping quantization levels to maintain constant sensitivity of the sensor system.

6. The system of claim 3 wherein said generalized random walk statistic approach comprises modeling a signal's up and down movements as a random walk.

7. The system of claim 3 wherein said generalized random walk statistic approach further comprises adjusting bits based on shift of an analog signal mean and variance over time.

8. A method for mitigating Analog to Digital clipping comprising the steps of:
receiving an analog input data from a sensor system;
tracking mean and variance of the analog input data;
tracking skewness of said input data;
dynamically reassigning bits of an Analog to Digital converter to keep said input data within the range of the Analog to Digital converter; and
converting the analog input data into digital data bits based on the dynamically reassigned bits, wherein a generalized random walk statistic approach is utilized for dynamically reassigning bits of the Analog to Digital converter to mitigate Analog to Digital clipping.

9. The method of claim 8 wherein the generalized random walk statistic approach utilizes the input data variable step sizes.

10. The method of claim 8 further comprising dynamically remappinq quantization levels of the Analog to Digital converter to maintain constant sensitivity of the sensor system.

11. The method of claim 8 wherein said generalized random walk statistic approach comprises modeling a signal's up and down movements as a random walk.

12. The method of claim 8 wherein said generalized random walk statistic approach further comprises adjusting bits based on shift of an analog signal mean and variance over time.

13. A method for mitigating Analog to Digital clipping comprising the steps of:
receiving an analog input data from a sensor system;
tracking mean and variance of an analog input data;
tracking skewness of said input data;
dynamically reassigning bits of an Analog to Digital converter to keep said input data within the range of the Analog to Digital converter; and
converting the analog input data into digital data bits based on the dynamically reassigned bits, wherein a generalized random walk statistic approach is utilized for dynamically reassigning bits of the Analog to Digital converter to mitigate Analog to Digital clipping, wherein the generalized random walk statistic approach utilizes the input data variable step sizes.

14. The method of claim 13 further comprising dynamically remapping quantization levels of the Analog to Digital converter to maintain constant sensitivity of the sensor system.

15. The method of claim 13 wherein said generalized random walk statistic approach comprises modeling a signal's up and down movements as a random walk.

16. The method of claim 13 wherein said generalized random walk statistic approach further comprises adjusting bits based on shift of an analog signal mean and variance over time.

* * * * *